(12) United States Patent
Lee et al.

(10) Patent No.: US 10,319,719 B2
(45) Date of Patent: Jun. 11, 2019

(54) SEMICONDUCTOR DEVICE STRUCTURE AND MANUFACTURING METHOD THEREOF

(71) Applicant: TAIWAN SEMICONDUCTOR MANUFACTURING COMPANY LTD., Hsinchu (TW)

(72) Inventors: Chen-Yi Lee, Keelung (TW); Shih-Fen Huang, Hsinchu County (TW); Pei-Lun Wang, Hsinchu County (TW); Dah-Chuen Ho, Hsinchu County (TW); Yu-Chang Jong, Hsinchu (TW); Mohammad Al-Shyoukh, Cedar Park, TX (US); Alexander Kalnitsky, San Francisco, CA (US)

(73) Assignee: Taiwan Semiconductor Manufacturing Company Ltd., Hsinchu (TW)

( * ) Notice: Subject to any disclaimer, the term of this patent is extended or adjusted under 35 U.S.C. 154(b) by 25 days.

(21) Appl. No.: 15/589,157

(22) Filed: May 8, 2017

(65) Prior Publication Data
US 2017/0243865 A1    Aug. 24, 2017

Related U.S. Application Data

(63) Continuation of application No. 14/954,011, filed on Nov. 30, 2015, now Pat. No. 9,666,574.

(51) Int. Cl.
*G05F 3/08* (2006.01)
*G05F 3/24* (2006.01)
(Continued)

(52) U.S. Cl.
CPC ............ *H01L 27/0883* (2013.01); *G05F 3/08* (2013.01); *G05F 3/242* (2013.01);
(Continued)

(58) Field of Classification Search
CPC ................ G05F 3/242; H01L 27/0883; H01L 21/82345
See application file for complete search history.

(56) References Cited

U.S. PATENT DOCUMENTS

| 9,401,362 | B2 * | 7/2016 | Zang | ................ H01L 27/0922 |
| 2007/0109039 | A1 * | 5/2007 | Watanabe | ............... G05F 3/242 |
| | | | | 327/541 |

(Continued)

OTHER PUBLICATIONS

Chinese First Office Action from China National Intellectual Property Administration dated Feb. 28, 2019, in corresponding Chinese application 201611092388.8 (9 pages in Chinese).

*Primary Examiner* — Farun Lu
(74) *Attorney, Agent, or Firm* — Juan Carlos A. Marquez; Marquez IP Law Office, PLLC

(57) ABSTRACT

A semiconductor device includes a first a first transistor configured to operate at a first threshold voltage level. The first transistor includes a first gate structure and a first drain terminal electrically coupled to the first gate structure. The semiconductor device also includes a second transistor configured to operate at a second threshold voltage level different from the first threshold voltage level. The second transistor includes a second source terminal and a second gate structure electrically coupled to the first gate structure. The first gate structure and the second gate structure comprise a first component in common, and the second gate structure further includes at least one extra component disposed over the first component. The number of the at least one extra component is determined by a desired voltage difference between the first threshold voltage level and the second threshold voltage level.

14 Claims, 15 Drawing Sheets

(51) Int. Cl.
*H01L 27/02* (2006.01)
*H01L 29/49* (2006.01)
*H01L 29/78* (2006.01)
*H01L 27/088* (2006.01)
*H01L 27/092* (2006.01)
*H01L 21/8234* (2006.01)
*H01L 21/8238* (2006.01)

(52) U.S. Cl.
CPC .............. *H01L 21/82345* (2013.01); *H01L 21/823885* (2013.01); *H01L 27/0222* (2013.01); *H01L 27/0922* (2013.01); *H01L 29/495* (2013.01); *H01L 29/4958* (2013.01); *H01L 29/4966* (2013.01); *H01L 29/785* (2013.01)

(56) References Cited

U.S. PATENT DOCUMENTS

| | | | |
|---|---|---|---|
| 2010/0038721 A1* | 2/2010 | Lin | H01L 21/28088 257/369 |
| 2015/0287725 A1 | 10/2015 | Zang | |

\* cited by examiner

SEMICONDUCTOR DEVICE STRUCTURE AND MANUFACTURING METHOD THEREOF

PRIORITY CLAIM AND CROSS-REFERENCE

This application is related to and is a continuation of U.S. non-provisional patent application Ser. No. 14/954,011 filed 2015 Nov. 30, the disclosure of which is hereby incorporated by reference in its entirety.

BACKGROUND

A field-effect transistor (FET) includes a threshold voltage. The threshold voltage is a minimum gate-to-source voltage differential that can create a conducting path between source and drain terminals.

A gate (or gate structure) provided in the FET. The gate controls the conducting path by applying voltages across a channel. When the voltages apply to the gate, electrical currents flow through the channel. When the voltages stop applying to the gate, electrical currents stop flowing through the channel. The voltage that turn on the FET is the threshold voltage. FETs with different threshold voltages can be combined to generate a reference voltage for different application.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

Figure 1:
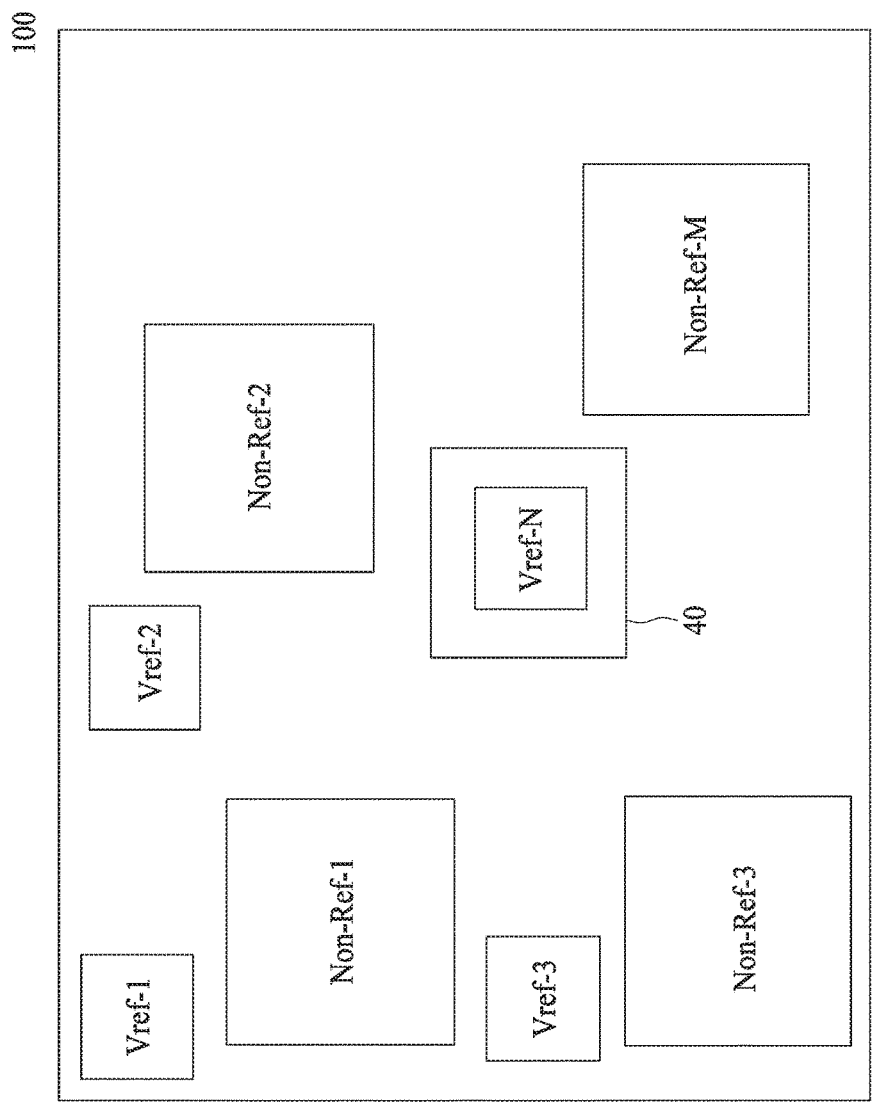
FIG. 1 is a top view of a semiconductor device, in accordance with some embodiments of the present disclosure.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

A field-effect transistor (FET) such as a positive-channel metal-oxide-semiconductor field-effect transistor (PMOS), negative-channel metal-oxide-semiconductor field-effect transistor (NMOS), or a FinFET can include a threshold voltage. The threshold voltage is a minimum gate-to-source voltage differential that can create a conducting path between source and drain terminals. The conducting path can be a conductive channel in a channel region.

In n-channel enhancement-mode devices such as NMOS, a positive gate-to-source voltage is necessary to create the conductive path. A positive voltage attracts free-floating electrons within a body of the n-channel enhancement-mode device towards a gate, forming a conductive channel. Charge carriers such as electrons are attracted near the gate to counter dopant ions added to the body. This forms a region with no mobile carriers called a depletion region, and the positive voltage at the gate when this occurs is the threshold voltage of the FET. Gate-to-source voltage increase attracts more electrons towards the gate. The gate is then able to create the conductive channel from source to drain; this process is called inversion.

When a gate voltage is below the threshold voltage, a transistor such as the FET is turned off and no current flows from drain to the source of the transistor. When the gate voltage is above the threshold voltage, the transistor is turned on. There are many electrons in a channel at the interface, creating a low-resistance channel where charge can flow from drain to source. For voltages significantly above the threshold, this situation is called strong inversion. For voltages just above the threshold voltage, this situation is called weak inversion.

Transistors including different threshold voltages can be coupled together in a circuit like a reference voltage circuit such that a voltage difference between the different threshold voltages can be a reference voltage.

In many applications, a precise and stable reference voltage is widely used in digital and analog circuits like analog-digital (A/D) and digital-analog (D/A) converters, voltage regulators, DRAM/flash memories and other communication devices. Developments for area reduction, low power consumption and low sensitivity to a supply voltage and temperature are increasing.

The reference voltage can be generated by a transistor pairs of a same type except for an opposite doping type of their gates. At identical drain currents, the voltage difference can be close to a silicon bandgap. Circuits can include a positive or a negative voltage reference.

Decreasing a level of the reference voltage can help lowering the power consumption in the reference voltage circuit. While increasing the level of the reference voltage can help minimizing sensitivity to voltage variation induced by noise from a supply voltage or temperature.

FIG. 1 illustrates a top view of a semiconductor device 100 including a multiple of reference voltage circuits and non-reference voltage circuits. The semiconductor device 100 includes N number of reference voltage circuits. For example, the reference voltage circuits are illustrated as Vref-1 up to Vref-N. The semiconductor device 100 may include M number of non-reference voltage circuits. For example, the non-reference voltage circuits are illustrated as Non-Ref-1 up to Non-Ref-M. In some embodiments, the number N equals to the number M. In some embodiments, each reference voltage circuit includes a different reference voltage than the other reference voltage circuit. Each reference voltage circuit provides a reference voltage for at least one non-reference voltage circuit.

In the present disclosure, semiconductor device 100 has at least two different reference voltages (i.e. two different types of reference voltage circuits), which are designed for the non-reference voltage circuits. However, the different types of reference voltage circuits can be formed by adopting an identical or a partial operation used to form the non-reference voltage circuits without an extra mask or operation. Through different combinations of the operations designed for the non-reference voltage circuits, the designer can allocate several desired areas to build different types of reference voltage circuits (Vref-1, 2 . . . ) in order to provide different options for the non-reference voltage circuits (Non-Ref-1, 2 . . . ).

Figure 2:
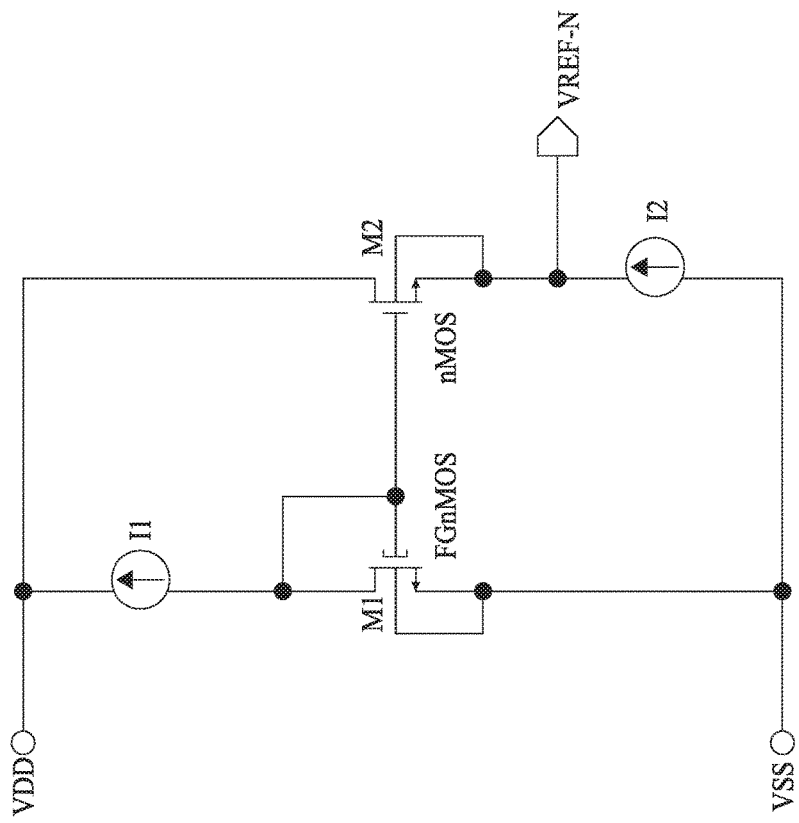
FIG. 2 is a circuit diagram of exemplary reference voltage circuits in the semiconductor device illustrated in FIG. 1.

A sectional view 40 encompasses one of the reference voltage circuits. FIG. 2 is a magnified view of the sectional view 40 in FIG. 1. The reference voltage circuit Vref-N includes coupling at least two transistors (M1 and M2) to generate a reference voltage level. The transistors can be a planar MOS or FinFET. When both transistors M1 and M2 are turned on, a difference of threshold voltage levels between M1 and M2 can detected in order to output the reference voltage level VREF-N. In the present disclosure, each reference voltage circuit includes a transistor pair like M1 and M2 in Vref-N. For example, reference voltage circuit Vref-1 has a transistor pair, M11 and M12, which generates a reference voltage level VREF-1. Reference voltage circuit Vref-2 has a transistor pair, M21 and M22, which generates a reference voltage level VREF-2. In the present disclosure, at least two different VREF are designed for device 100.

Take reference voltage circuits Vref-1 and Vref-2 as an example, in order to have at least two different VREF, at least three different threshold voltage combinations for transistors M11, M12, M21, and M22, there are (M11=M21, M12≠M22), (M11≠M21, M12=M22), or (M11≠M21, M12≠M22). It should be appreciated that when there are N numbers of different VREF required, the combinations of the transistor pairs in device 100 can be a great number. However, in the present disclosure, no matter how many different VREF required, all combinations of the transistor pairs can be realized by adopting the operations designed for non-reference voltage circuit.

In some embodiments, operations for manufacturing some gates in the non-reference voltage circuit are adopted to form the transistor pair in a reference voltage circuit. In some embodiments, a gate of a transistor of a reference voltage circuit may include components (identical or partial) designed for building a gate of a non-reference voltage circuit. The word "component" used throughout this disclosure means a film or film stack of a gate in a transistor. The gate can be a planar gate for greater geometry such as N40 or above, or a composite gate such as a metal gate for more advanced technology node such as N28 or beyond. The component of each reference voltage circuit is formed while forming component in one or more non-reference voltage circuit. The property such as conductive type, thickness of the component in the reference voltage circuit may be identical to a corresponding component designed for a non-reference voltage circuit in the same device. However, the arrangement, such as sequence of stacking or dimension may be different.

Take M1 and M2 in circuit Vref-N as an example, an α component of M1 is formed while forming an α component in a transistor in circuit Non-Ref-1 and a β component of M1 is formed while forming a β component in a transistor in circuit Non-Ref-1. A β component of M2 is formed while forming a β component in a transistor in circuit Non-Ref-1 and a δ component of M2 is formed while forming an δ component in a transistor in circuit Non-Ref-3. Therefore, M1 has a gate structure encompassing α and β and M2 has a gate structure encompassing β and δ. By differentiating the work function of α, β and δ, a desired reference voltage Vref-1 can be generated. The differentiation can be realized through a selection from a predetermined component designed for a non-reference voltage circuit.

The same methodology can be expanded to generate various reference voltage applications (e.g. some for low power consumption application and some for high voltage application) through selecting several predetermined components designed for different gates of one or more non-reference voltage circuit. For example, a semiconductor device similar to the device 100 in FIG. 1 is designed to have at least three different reference voltage circuits, Vref-1, Vref-2, and Vref-3. The output reference voltage of Vref-1 is between about 0.1 to 350 mV, the output reference voltage of Vref-2 is from about 350 to 700 mV, and the output reference voltage of Vref-3 is between about 700 mV to 1.0V. In order to have three different reference voltage circuits developed in the same device 100 without consuming extra mask or operation, the manufacturing operations for non-reference voltage circuit(s) can be adopted while forming the reference voltage circuits, Vref-1, Vref-2, and Vref-3. For example, some predetermined manufacturing operations for non-reference voltage circuit(s) may generate several different components for their transistors, the different components may at least have α1, α2, α3, α4, β1, β2, β3, β4. The components αx and βx are the elements used to design the gate structure in non-reference voltage circuit(s).

If the desired threshold voltage of M11 in Vref-1 can be designed by forming a gate structure having components, α1 and β1, then the operations for manufacturing α1 and β1 in a corresponding non-reference voltage circuit are adopted. Such that the α1 and β1 in Vref-1 are formed while forming the α1 and β1 in a corresponding non-reference voltage circuit. In some embodiments, formation of M11 can be realized by just revising the mask for manufacturing the corresponding non-reference voltage circuit without adding an extra mask. By applying the same methodology, components of gates in other transistors can be formed by selecting different combinations of α1, α2, α3, α4, β1, β2, β3, β4 to form different gate structures to have various threshold voltages, so as to form various reference voltage circuits.

Figure 3A:
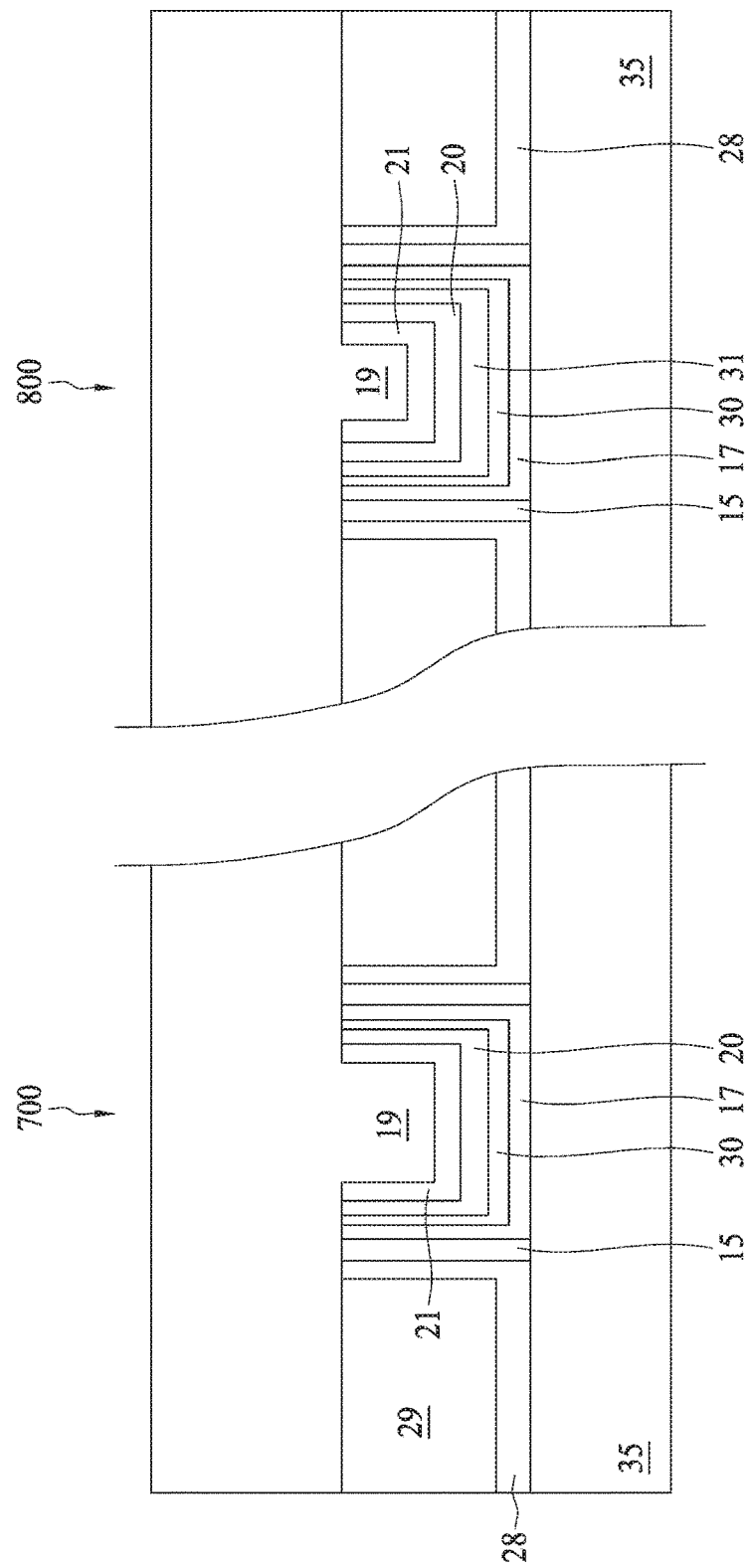
FIGS. 3A to 3C are cross-sectional views of a semiconductor device, in accordance with some embodiments of the present disclosure.
Figure 3B:
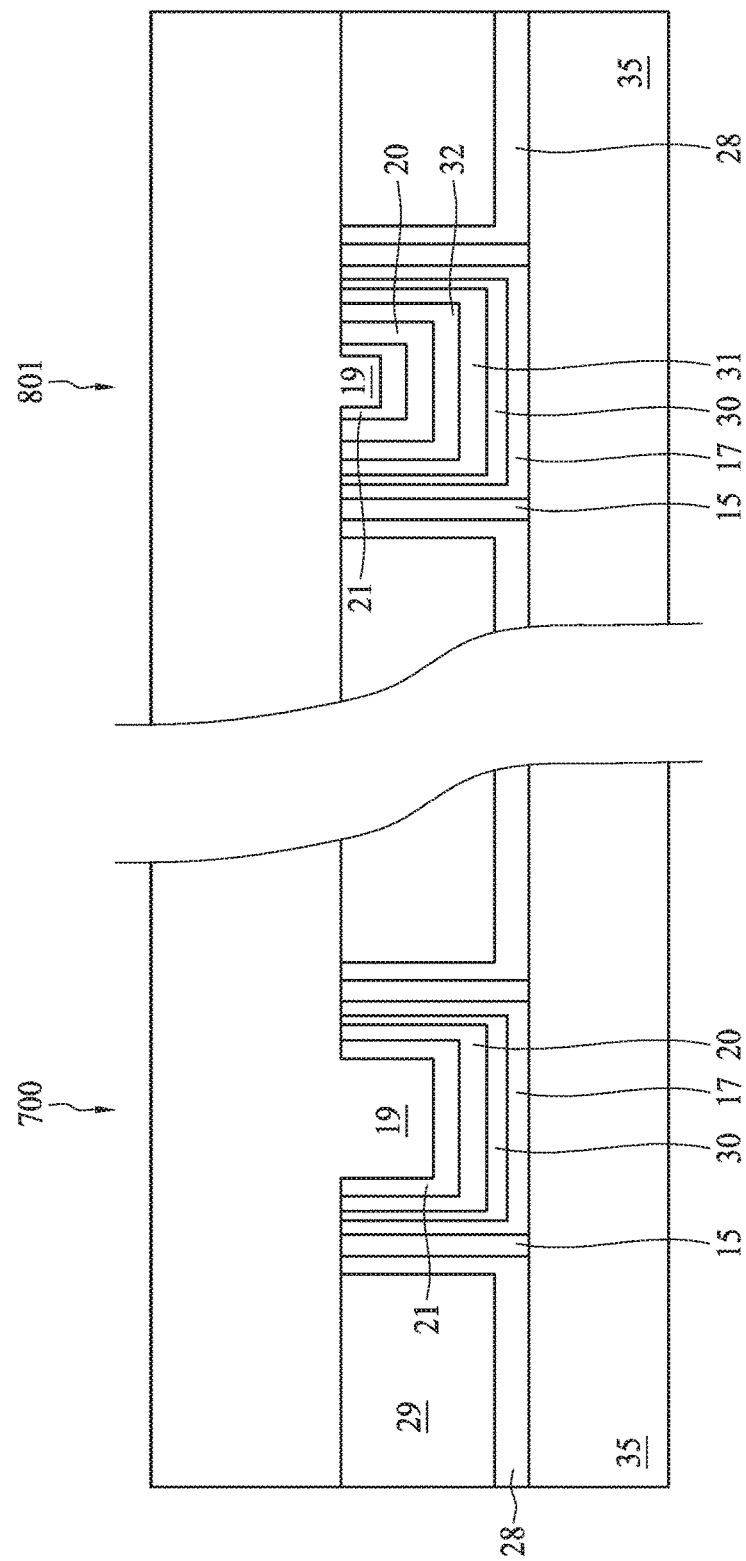
Figure 3C:
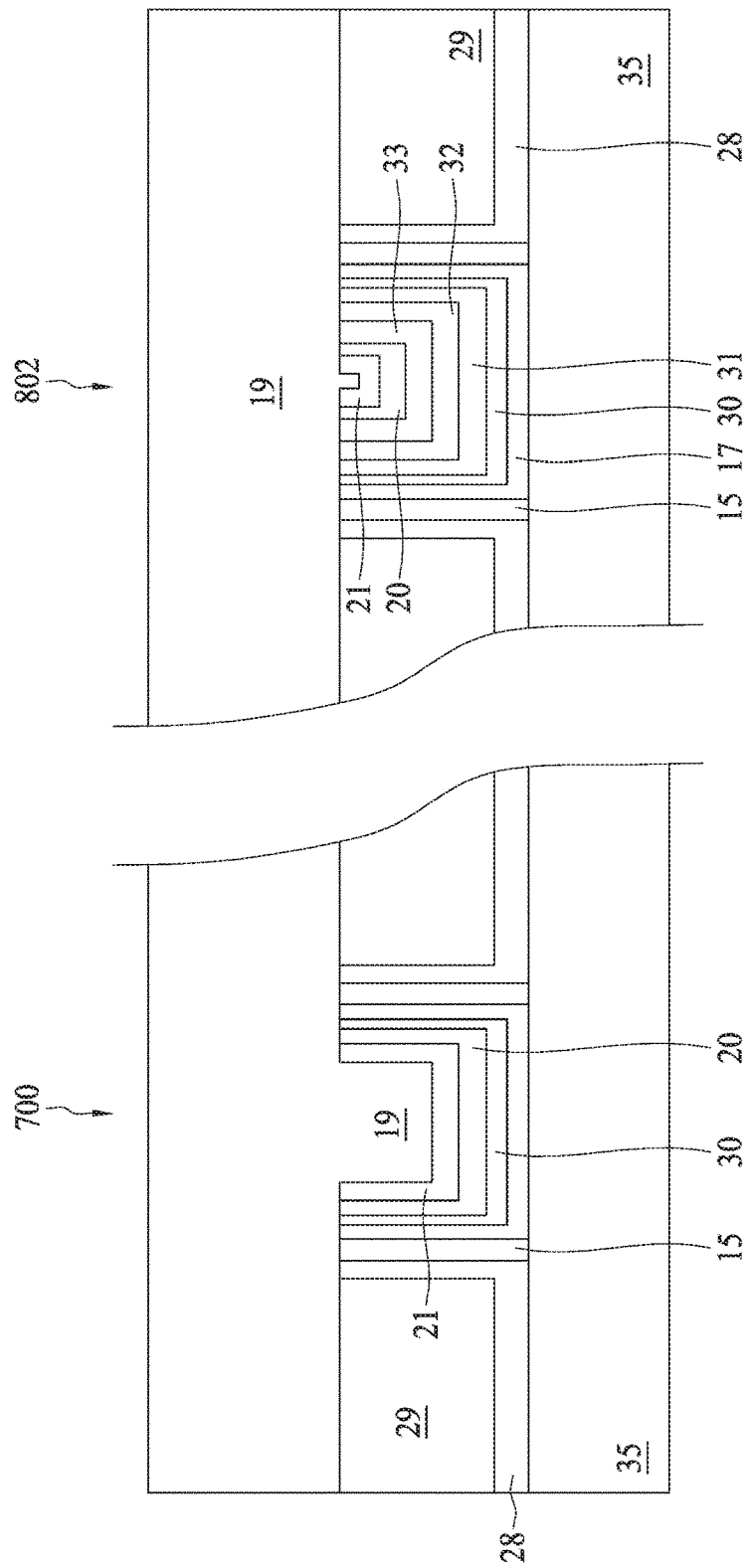

FIG. 3A through FIG. 3C are cross sectional views of an embodiment including three different reference voltage circuits, which include three different combinations of transistor pair to generate three different reference voltages. Each drawing has two gates corresponding to the transistor pair as shown in FIG. 2 for a different reference voltage circuit, and each transistor pair has a reference voltage different than the other transistor pair. In the present embodiment, each transistor pair has a first transistor. Since the first transistor of each transistor pair has a same threshold voltage and structure, they are all denoted as transistor 700. Moreover, each transistor pair has a second transistor 80*x* (800, 801, or 802). In the present embodiment, transistors 800, 801, and 802 each has a different threshold voltage than the other. In some embodiments, the first transistor is called base transistor and the second transistor is called flip transistor. The components in the base transistor only have an intrinsic or a first conductive type (such as n-type). The components in the flip transistor can have an intrinsic, a first conductive type (such as n-type) and a second conductive type, which is opposite to the first conductive type. All three transistor pairs are formed while forming some components of a gate (or gates) of at least one non-reference voltage circuit, which is not shown in the drawings.

In FIG. 3A, transistors 700 and 800 each has a semiconductive substrate 35. Transistor 700 includes a first threshold voltage. Transistor 800 includes a second threshold voltage. The second threshold voltage is different from the first threshold voltage. The transistor 700 or 800 includes a base metal gate layer 30. In some embodiments, the base metal gate layer 30 is a negative metal gate layer including a negative type dopant (or called n-type). In addition, the transistor 800 includes a flip metal gate layer 31 over the base metal gate layer 30. The flip metal gate layer 31 includes a conductive type dopant opposite to the conductive type dopant of the base metal gate layer 30. In some embodiments, the flip metal gate layer 31 includes a positive type dopant (or called p-type).

In some embodiments, transistor 700 further has a first gate metal 20 disposed on the base metal gate layer 30. A second gate metal 21 is optionally disposed on the first gate metal 20. The base metal gate layer 30 is between the first gate metal 20 and semiconductive substrate 35. A gate filling layer 19 is over the base metal gate layer 30. In some embodiments, the gate filling layer 19 is disposed on the second gate metal 21. The gate filling layer 19 can include conductive material such as tungsten, aluminum, or copper. The gate metals such as first gate metal 20 and the second gate metal 21 are between the gate filling layer 19 and the base metal gate layer 30. Gate spacer 15 is lined to the gate dielectric layer 17. A nitride layer 28 is lined to the gate spacer 15 and covered on top of the semiconductive substrate 35. ILD layer 29 is on the nitride layer 28. The gate metals such as first gate metal 20 and second gate metal 21 form electrical coupling between the gate filling layer 19 and the base metal gate layer 30. In some embodiments, the base metal gate layer 30, the flip metal gate layer 31, the first gate metal 20, or the second gate metal 21 includes materials such as Tantalum nitride (TaN), Titanium Nitride (TiN), Tantalum (Ta), or Titanium (Ti). In some embodiments, the base metal gate layer 30, the flip metal gate layer 31, the first gate metal 20, or the second gate metal 21 includes thicknesses in a range from around 0.5 angstroms to around 50 angstroms. The flip metal gate layer 31 has a conductive type different than the base metal gate layer 30. For example, if the base metal gate layer 30 is n-type, the flip metal gate layer 31 is p-type.

In FIG. 3B, transistor 801 includes an additional flip metal gate layer 32 compared to the transistor 800 in FIG. 3A, to form a reference voltage circuit with a reference voltage different than that in FIG. 3A. The first gate metal 20 is disposed on flip metal gate layer 32. The flip metal gate layer 32 is between the flip metal gate layer 31 and the first gate metal 20. The flip metal gate layers 32 and 31 have a same conductive type (p-type or n-type). In some embodiments, the flip metal gate layer 32 is similar to a structure and composition of the flip metal gate layer 31.

Accumulation of positive charge particles by addition of another flip metal gate layer 32 can change the threshold voltage of the transistor 801 different from that of the transistor 800. However, the addition of another flip metal gate layer 32 is formed while forming a same component in a non-reference voltage circuit.

In FIG. 3C, transistor 802 includes an additional flip metal gate layer 33 compared to transistor 801 in FIG. 3B. The additional flip metal gate layer 33 is between the flip metal gate layer 32 and the gate metal such as the first gate metal 20. The flip metal gate layers 32 and 33 have a same conductive type (p-type or n-type). In some embodiments, the flip metal gate layer 32 is similar to a structure and composition of the flip metal gate layer 33. Similar to flip metal gate layer 32, the addition of another flip metal gate layer 33 is formed while forming a same component in a non-reference voltage circuit.

The flip transistor can include different possible threshold voltage levels by including different number of flip metal gate layers. The different threshold voltage level corresponds to the number of flip metal gate layers. In some embodiments, when each flip metal gate layer is similar to each other, threshold voltage levels are different from one another by a predetermined increment.

Figure 4:
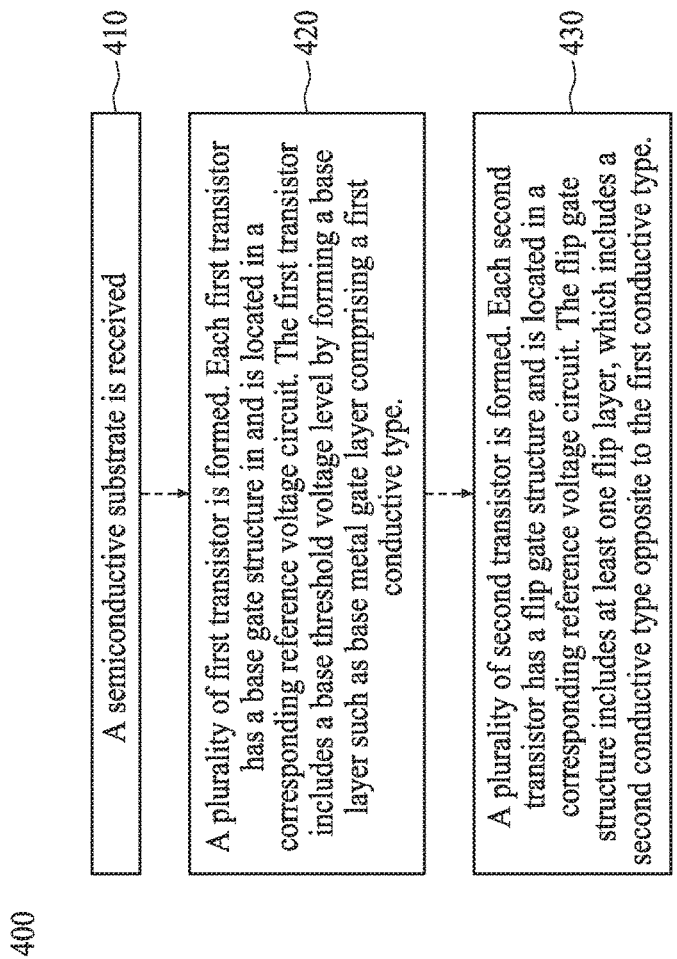
FIG. 4 is an operational flow of a method for manufacturing a semiconductor device, in accordance with some embodiments of the present disclosure.
Figure 5:
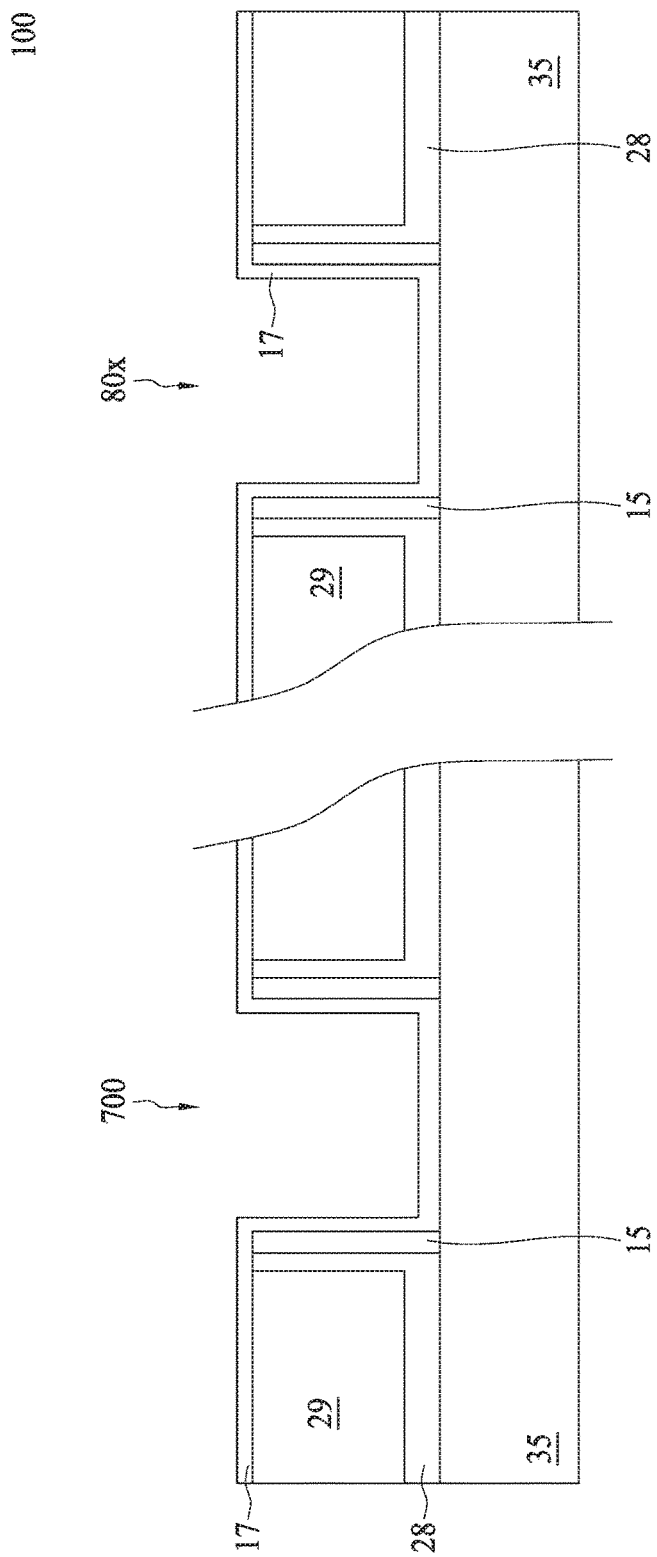
FIGS. 5 to 10 are some cross-sectional views of operations in a method for manufacturing a semiconductor device, in accordance with some embodiments.
Figure 6:
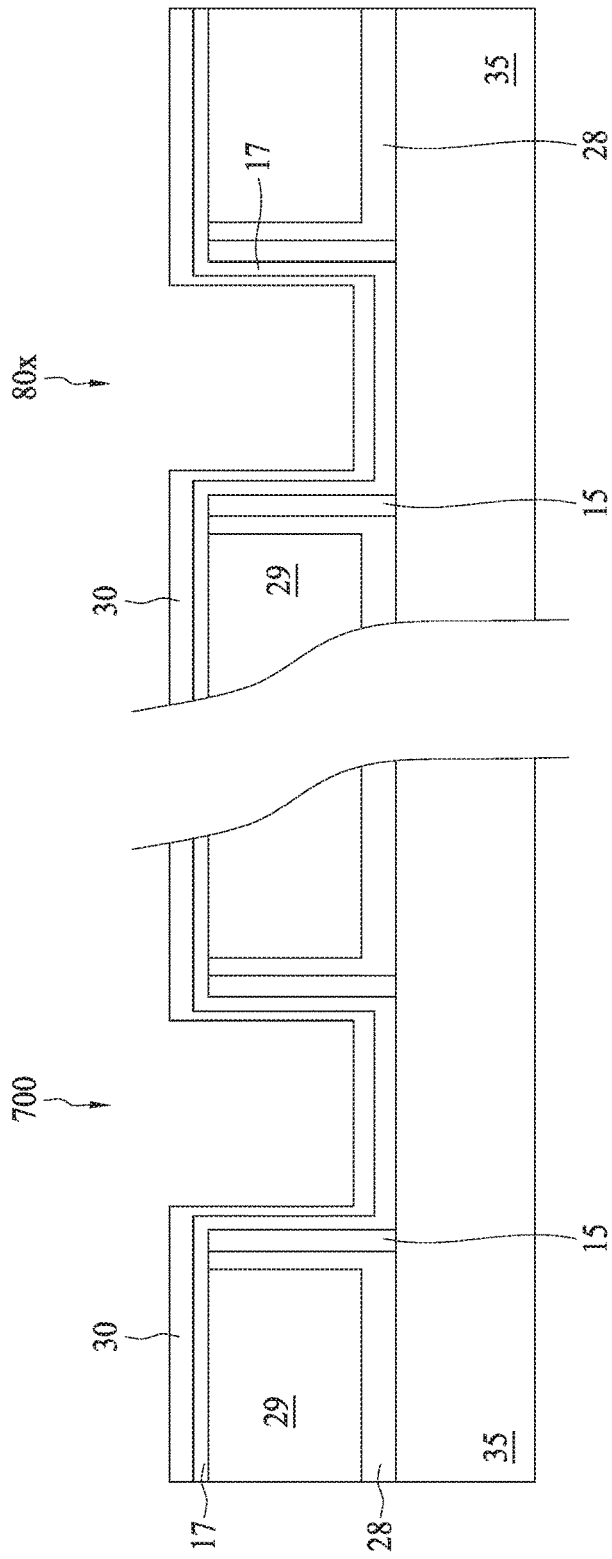

In FIG. 4, an exemplary method of manufacturing semiconductor device 100 in FIG. 1 is illustrated. In operation 410, a semiconductive substrate 35 is received. Some exemplary embodiments for operation 410 are illustrated in FIG. 5. Operation 420 forms a plurality of first transistor. Each first transistor has a base gate structure in and is located in a corresponding reference voltage circuit. The first transistor includes a base threshold voltage level by forming a base layer such as base metal gate layer 30 comprising a first conductive type. Some exemplary embodiments for operation 420 are illustrated in FIG. 6.

Figure 7:
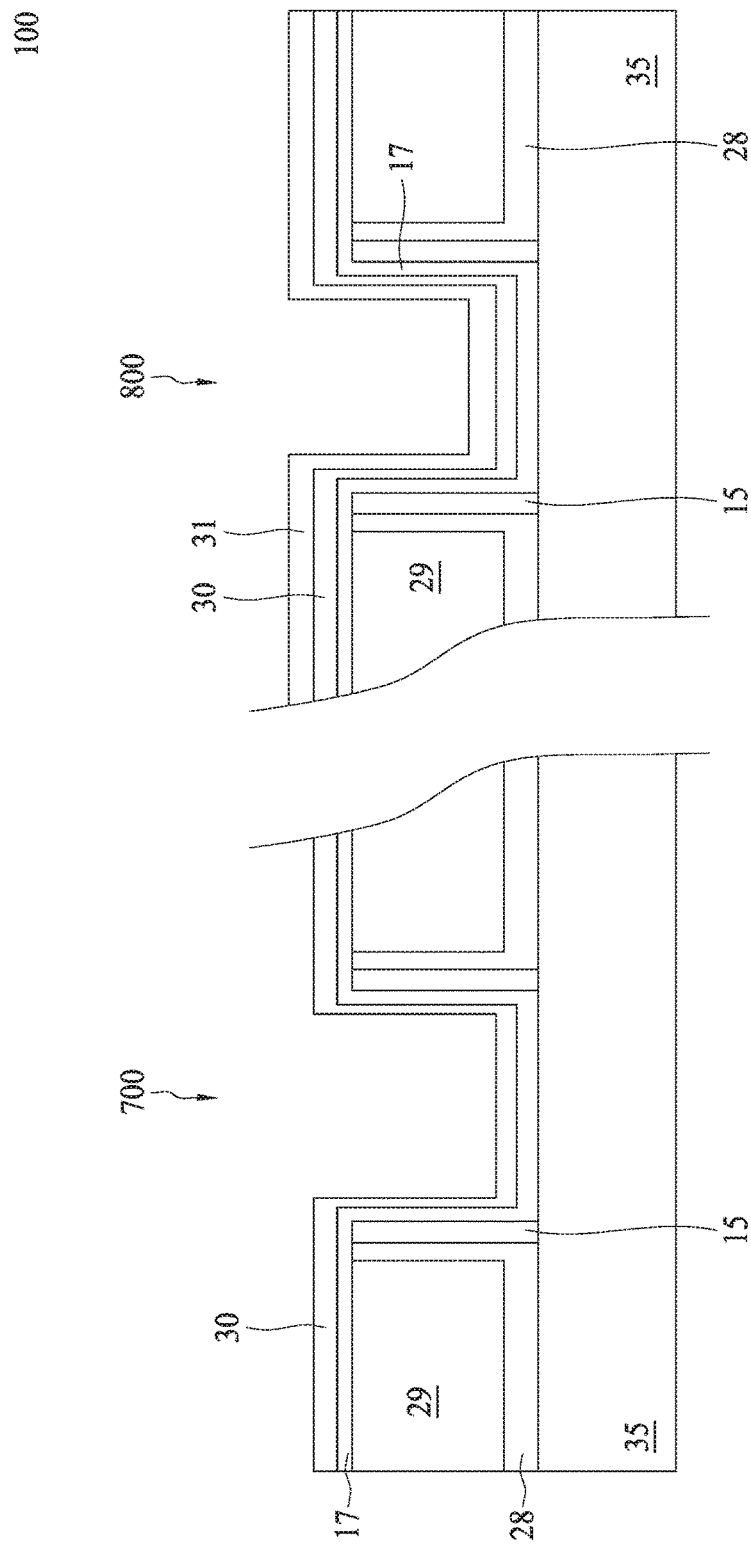
Figure 8:
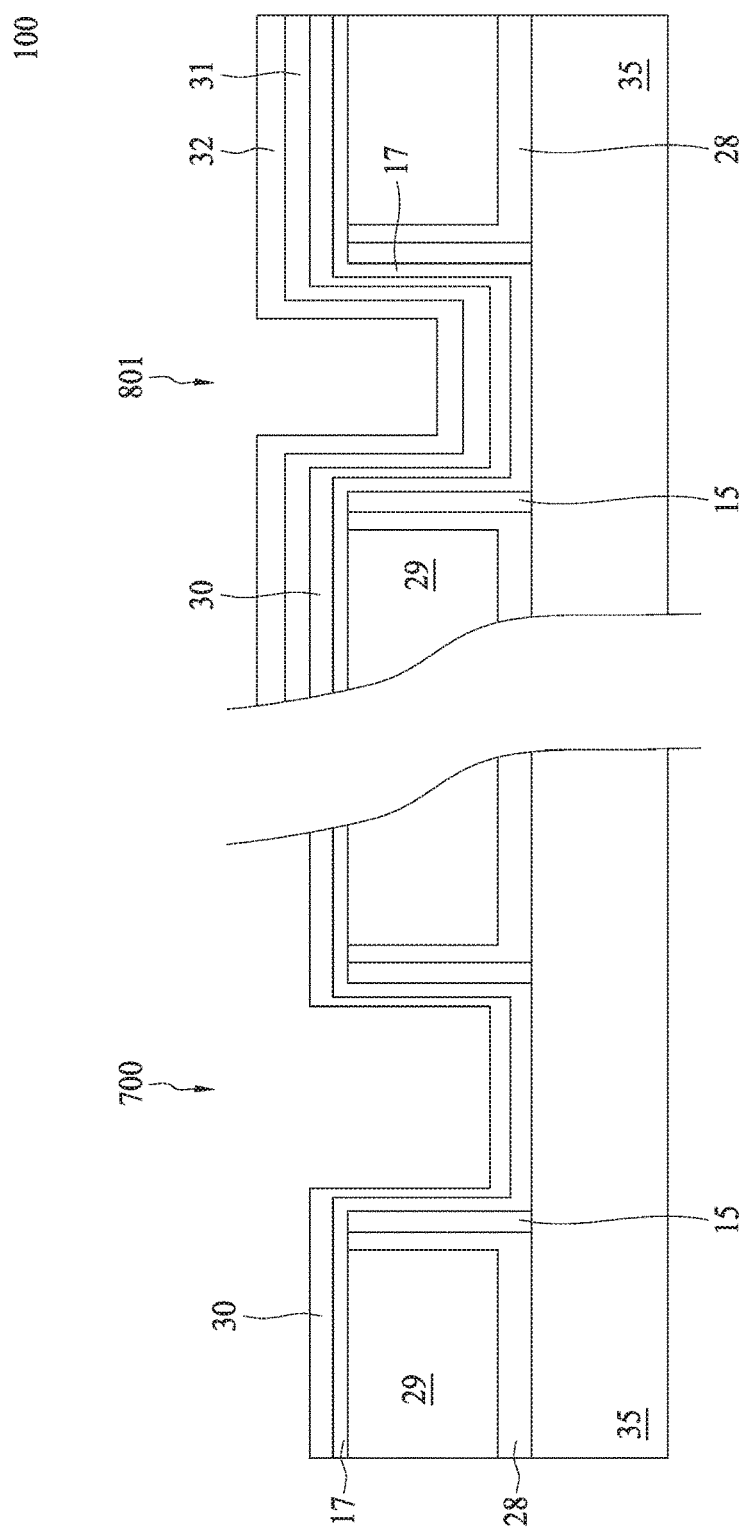
Figure 9:
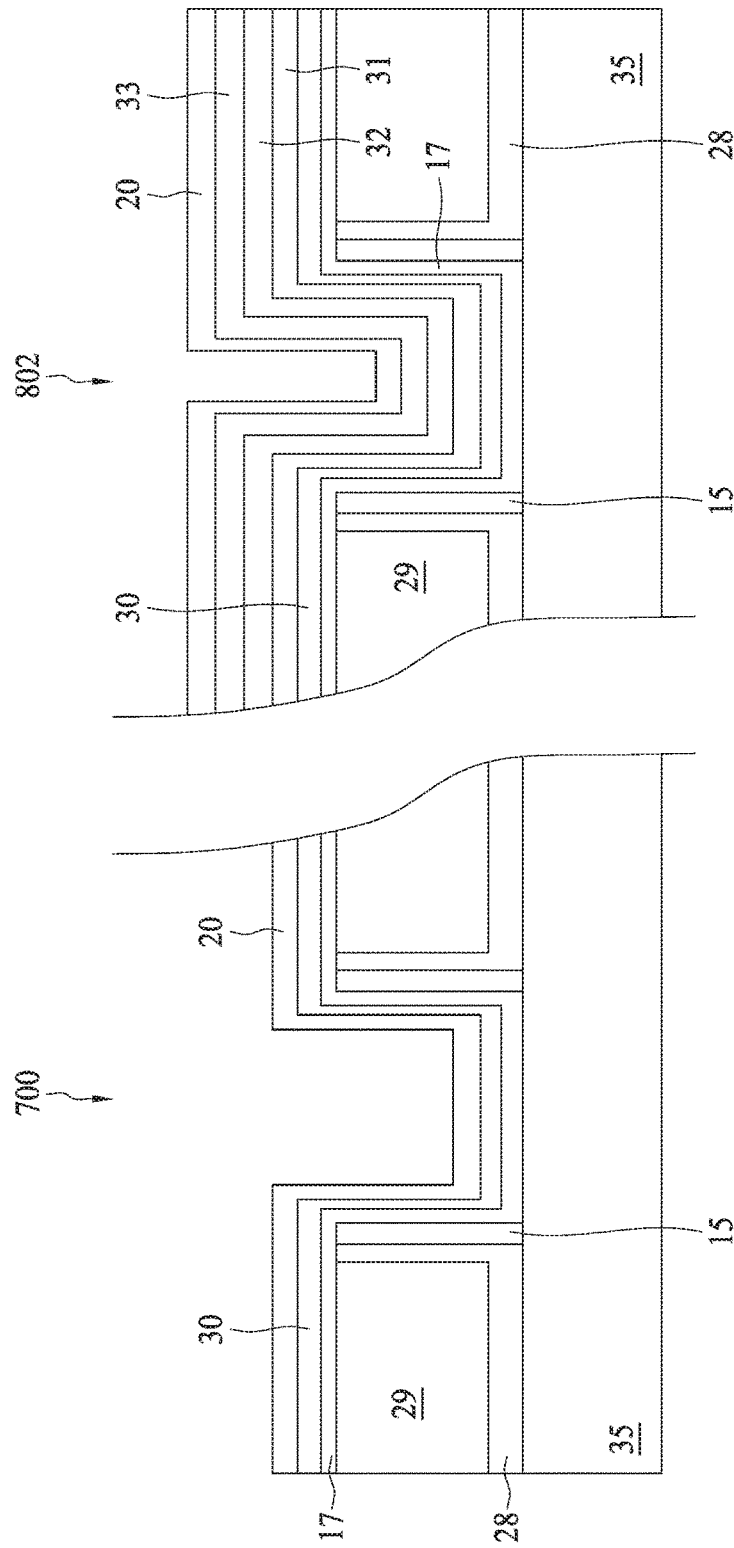

Operation 430 forms a plurality of second transistor. Each second transistor has a flip gate structure and is located in a corresponding reference voltage circuit. Each second transistor is coupled with a corresponding first transistor formed in operation 420. The flip gate structure includes at least one flip layer, which includes a second conductive type opposite to the first conductive type. Each second transistor has a threshold voltage different than the other and the threshold voltage differentiation is determined by the different combination of the flip layer. Some exemplary embodiments for operation 430 are illustrated in FIGS. 7 to 9. Transistor 800 has flip layer 31, transistor 801 has flip layers 31 and 32, and transistor 802 has flip layers 31, 32 and 33. An optional gate metal 20 can be disposed thereon.

Figure 10:
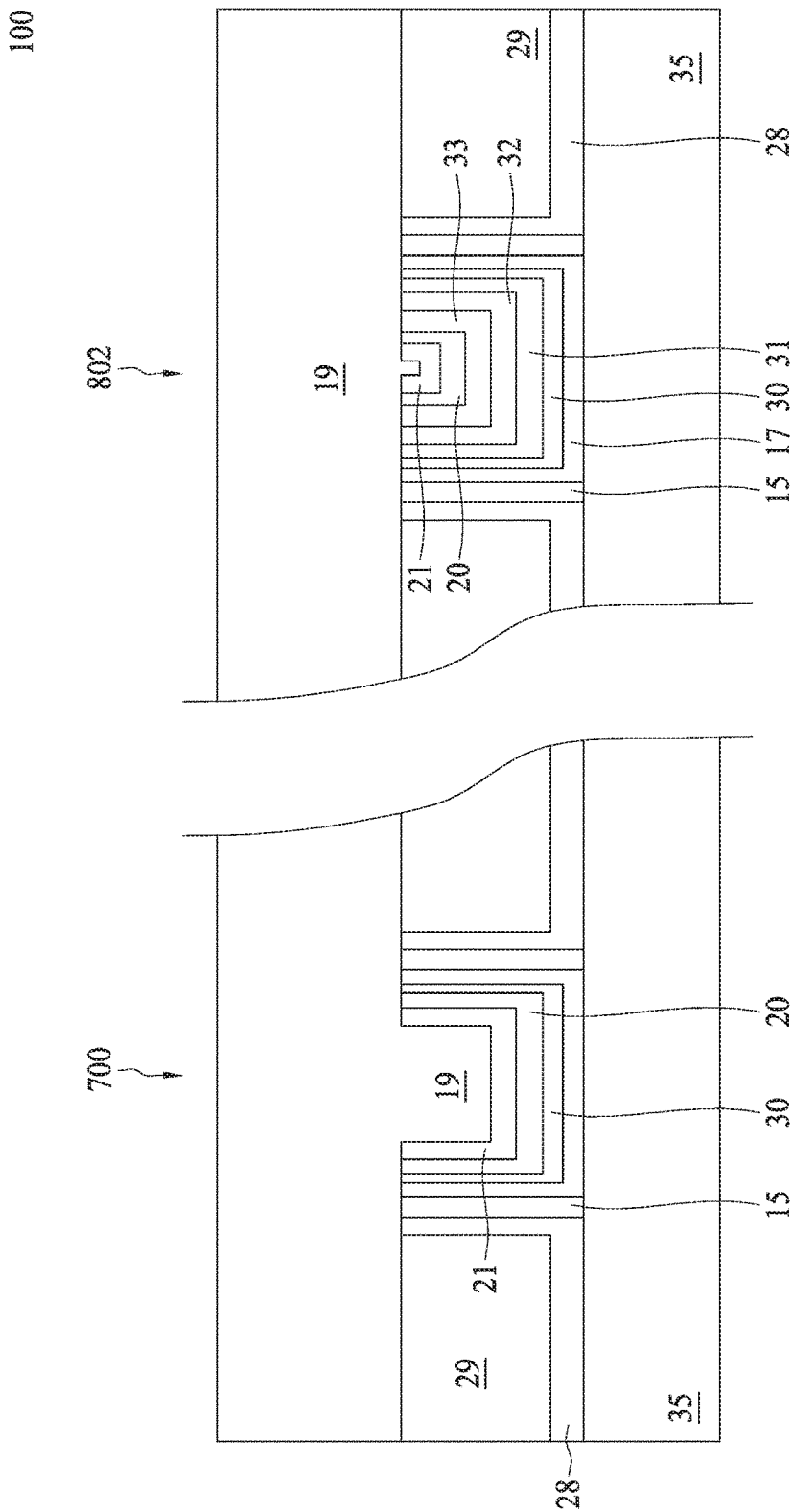

In FIG. 10, the gate filling layer 19 is formed to cover the first gate metal 20. The gate filling layer 19 can be formed by deposition such as CVD (Chemical Vapor Deposition), PVD (Physical Vapor Deposition), or ALD (Atomic Layer Deposition), etc.

Figure 11:
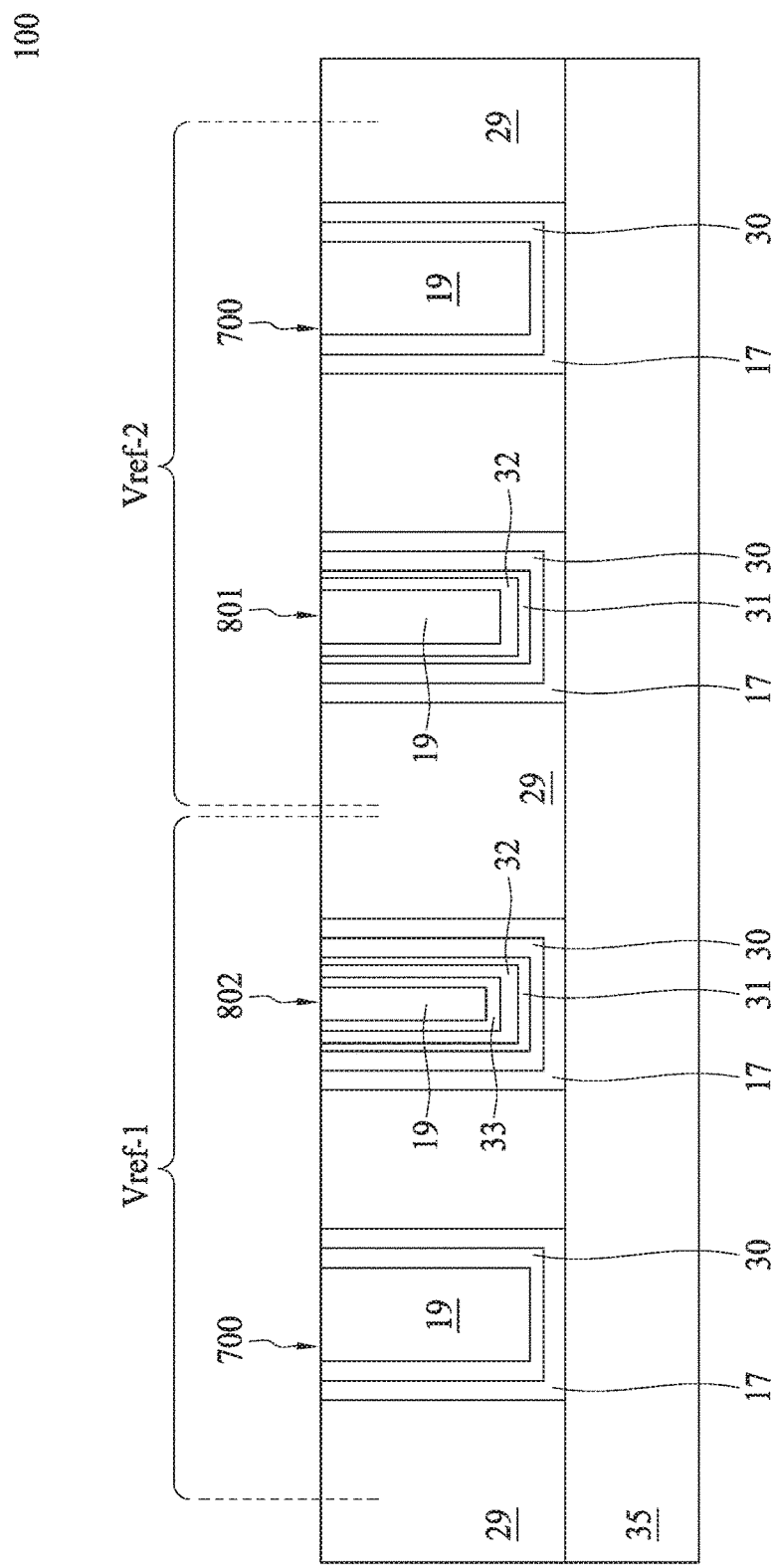
FIGS. 11 to 13 are some cross-sectional views of operations in a method for manufacturing a semiconductor device, in accordance with some embodiments.

In FIG. 11, a CMP operation is introduced to remove excessive gate filling layer 19 to have a planar surface to expose the dielectric layer 29. A top of the gate metal and a dielectric layer 29 can be coplanar.

Figure 12:
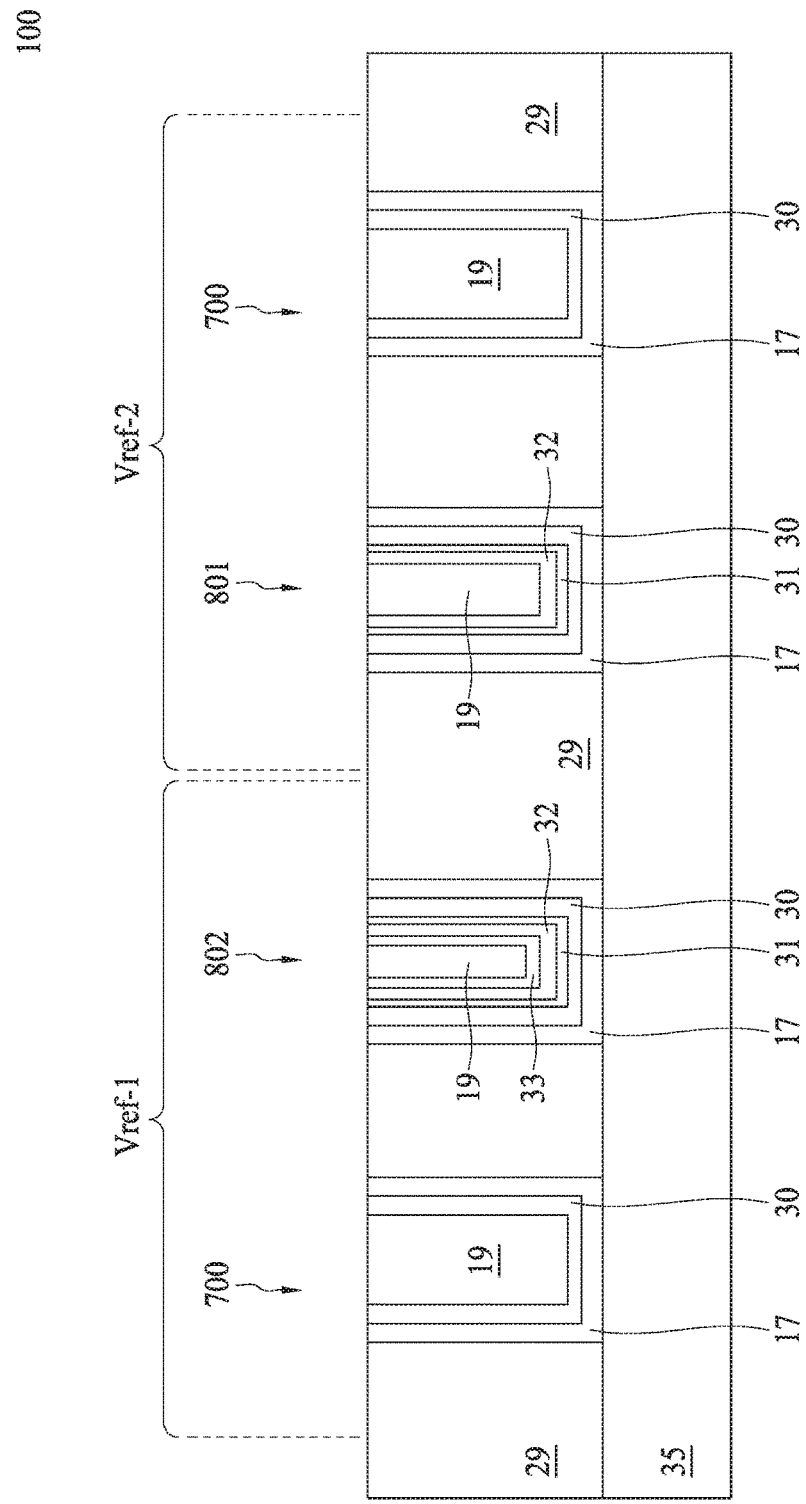

In FIG. 12, the reference voltage circuit Vref-1 or the reference voltage circuit Vref-2 includes a base transistor 700 such as the first transistor and a flip transistor 802 as the second transistor. The reference voltage circuit Vref-1 includes transistors 700 and the gate structure 802 formed on the semiconductive substrate 35. The reference voltage circuit Vref-2 includes the transistors 700 and 801 formed on the semiconductive substrate 35.

Figure 13:
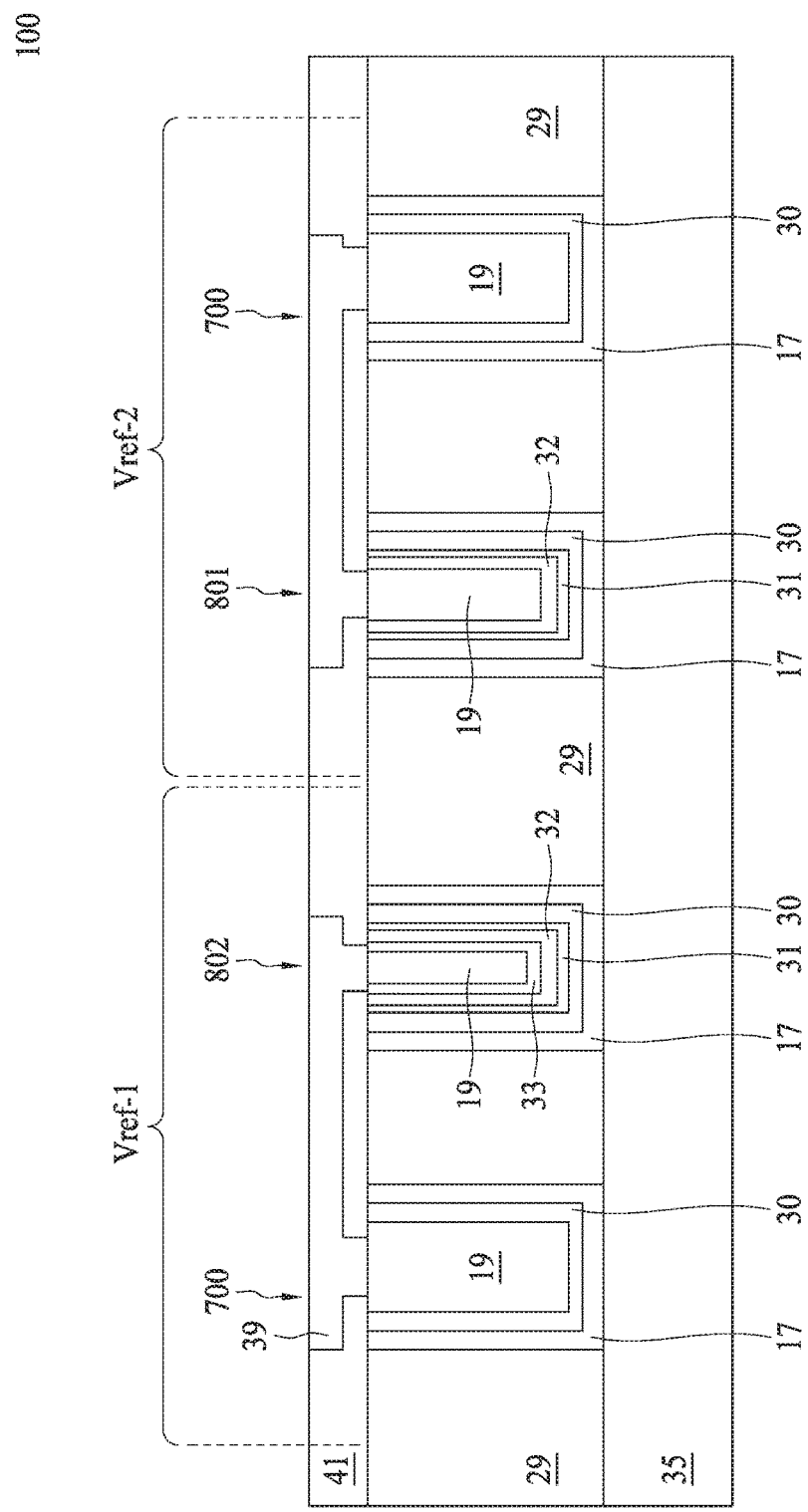

In FIG. 13, conductive layer 39 can be formed over the gate structures and the dielectric layer 29 to couple transistors 700 and 802 to form a portion of reference voltage circuit Vref-1. The conductive layer 39 is also patterned to couple 700 and 801 to form a portion of reference voltage circuit Vref-2.

Some embodiments of the present disclosure provide a semiconductor device. The semiconductor device includes a first transistor configured to operate at a first threshold voltage level. The first transistor includes a first gate structure and a first drain terminal electrically coupled to the first gate structure. The semiconductor device also includes a second transistor configured to operate at a second threshold voltage level different from the first threshold voltage level. The second transistor includes a second source terminal and a second gate structure electrically coupled to the first gate structure. The first gate structure and the second gate structure comprise a first component in common having a first conductive type, and the second gate structure further includes at least one extra component, having a second conductive type opposite the first conductive type, disposed over the first component. The first transistor and the second transistor are coupled such that the number of the at least one extra component is determined by a desired voltage difference between the first threshold voltage level and the second threshold voltage level.

Some embodiments of the present disclosure provide a semiconductor device having a first reference voltage circuit. The first reference voltage circuit includes a first transistor having a first gate structure and a first drain terminal. The first gate structure includes a first layer has a first conductive type. The first reference voltage circuit also includes a second transistor configured to include a threshold voltage level different than a threshold voltage of the first transistor. The second transistor includes a second gate structure, a second drain terminal and a source terminal. The second gate structure includes a second layer having the first conductive type. The first reference voltage circuit further includes a current source disposed between the source terminal and a ground terminal. Each of the first gate structure and the second gate structure further comprises a metal layer, the second gate structure further comprises a third layer disposed between the metal layer of the second transistor and the second layer, where the third layer is absent from the first gate structure. A first reference voltage level, defined as the difference between the threshold voltages of the first transistor and the second transistor, at a node between the source terminal and the current source is provided for a first non-reference circuit in the semiconductor device.

Some embodiments of the present disclosure provide semiconductor device. The semiconductor device includes a first transistor which has a first gate structure, a first drain terminal and a first source terminal. The first gate structure comprises a first stack of conductive layers. The semiconductor device also includes a second transistor which has a second gate structure, a second drain terminal and a second source terminal. The second gate structure comprises a second stack of conductive layers substantially same as the first stack of conductive layers except that a metal layer in the second stack of conductive layers is absent from the first stack of conductive layers. The semiconductor device further includes a current source disposed between the second source terminal and a ground terminal. The first source terminal is connected to a substrate terminal of the first transistor, the second source terminal is connected to a substrate terminal of the second transistor, and a first reference voltage level at a node between the second source terminal and the current source is provided for a first non-reference circuit in the semiconductor device.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:
1. A semiconductor device, comprising:
a first reference voltage circuit including:
    a first transistor formed on a semiconductor substrate and comprising a first gate structure and a first drain terminal, the first gate structure comprising a first layer having a first conductive type;
    a second transistor formed on the semiconductor substrate and configured to include a threshold voltage level different than a threshold voltage of the first transistor, the second transistor comprising a second gate structure, a second drain terminal and a source terminal, the second gate structure comprising a second layer having the first conductive type; and
    a current source disposed between the source terminal and a ground terminal; and
a second reference voltage circuit including:
    a third transistor comprising a third gate structure having a fourth layer; and
    a fourth transistor configured to include a threshold voltage level different than a threshold voltage of the third transistor, the fourth transistor including a fourth gate structure, the fourth gate structure comprising:
    a fifth layer; and
    a sixth layer disposed over the fifth layer, wherein
each of the first gate structure and the second gate structure further comprises a metal layer, the metal layer of the first and second gate structures being formed between the semiconductor substrate and each of the first layer of the first transistor and the second layer of the second transistor,
the second gate structure further comprises a third layer disposed between the metal layer of the second transistor and the second layer, the third layer being absent from the first gate structure,
a first reference voltage level, defined as the difference between the threshold voltages of the first transistor and the second transistor, at a node between the source terminal and the current source is coupled to a first non-reference circuit in the semiconductor device, and
the third transistor and the fourth transistor are coupled to provide a second reference voltage for a second non-reference circuit in the semiconductor device and the second reference voltage is different from the first reference voltage.

2. The semiconductor device of claim 1, wherein the sixth layer comprises a second conductive type opposite to the first conductive type.

3. The semiconductor device of claim 1, wherein the fourth transistor further comprises a seventh layer over the sixth layer and the seventh layer comprises the second conductive type.

4. The semiconductor device of claim 1, further comprising at least one extra reference voltage circuit, and the at least one extra reference voltage circuit provides a reference voltage different than the first reference voltage and the second reference voltage.

5. The semiconductor device of claim 1, wherein the first layer and the fourth layer include a substantially same thickness.

6. The semiconductor device of claim 1, further comprising a third non-reference circuit having a fifth gate structure, wherein at least one of the first gate structure and the second gate structure comprises a layer same as a layer in the fifth gate structure.

7. The semiconductor device of claim 1, wherein the first layer and the second layer include a substantially same thickness.

8. The semiconductor device of claim 1, further comprising a third non-reference circuit having a gate structure, wherein at least one of the first non-reference circuit and the third non-reference circuit comprises a first conductive layer, and the first reference voltage circuit comprises at least one conductive layer same as the first conductive layer.

9. The semiconductor device of claim 1, wherein the first conductive type is n-type.

10. The semiconductor device of claim 1, wherein the first transistor or the second transistor is a FinFET.

11. The semiconductor device of claim 1, wherein the first layer includes TaN, TiN, Ta, or Ti.

12. The semiconductor device of claim 1, wherein the third layer includes TaN, TiN, Ta, or Ti.

13. The semiconductor device of claim 1, wherein the difference between the threshold voltages of the first transistor and the second transistor is between about 350 mV to about 700 mV.

14. The semiconductor device of claim 1, wherein the first layer includes a thickness in a range from around 0.5 angstroms to around 50 angstroms.

* * * * *